(12) United States Patent
Gratz

(10) Patent No.: US 6,717,205 B2
(45) Date of Patent: Apr. 6, 2004

(54) VERTICAL NON-VOLATILE SEMICONDUCTOR MEMORY CELL AND METHOD FOR MANUFACTURING THE MEMORY CELL

(75) Inventor: Achim Gratz, Steinbach-Hallenberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/940,001

(22) Filed: Aug. 27, 2001

(65) Prior Publication Data

US 2002/0024081 A1 Feb. 28, 2002

(30) Foreign Application Priority Data

Aug. 27, 2000 (DE) .......................... 100 41 749

(51) Int. Cl.7 .................... H01L 21/8247; H01L 29/788
(52) U.S. Cl. ......................... 257/316; 257/321; 438/259
(58) Field of Search ................... 257/316; 438/257–267

(56) References Cited

U.S. PATENT DOCUMENTS

| | | | | |
|---|---|---|---|---|
| 5,399,516 A | * | 3/1995 | Bergendahl et al. | 438/242 |
| 5,457,061 A | * | 10/1995 | Hong et al. | 438/261 |
| 5,468,663 A | * | 11/1995 | Bertin et al. | 438/259 |
| 5,616,510 A | | 4/1997 | Wong | |
| 5,656,544 A | * | 8/1997 | Bergendahl et al. | 438/243 |
| RE35,810 E | * | 5/1998 | Prall | 257/315 |
| 5,973,356 A | * | 10/1999 | Noble et al. | 257/314 |
| 6,008,091 A | * | 12/1999 | Gregor et al. | 438/240 |
| 6,034,389 A | | 3/2000 | Burns, Jr. et al. | |

FOREIGN PATENT DOCUMENTS

WO     WO 97/02599     1/1997

* cited by examiner

Primary Examiner—Richard A. Booth
(74) Attorney, Agent, or Firm—Laurence A. Greenberg; Werner H. Stemer; Gregory L. Mayback

(57) ABSTRACT

A vertical non-volatile semiconductor memory cell and an associated manufacturing method in which a trench extension, which has a third dielectric layer and a filler material, is formed underneath the vertical semiconductor memory cell with its first dielectric layer, its charge storage layer, its second dielectric layer and its control layer. In this way, the data retention properties and a coupling factor are improved.

13 Claims, 5 Drawing Sheets

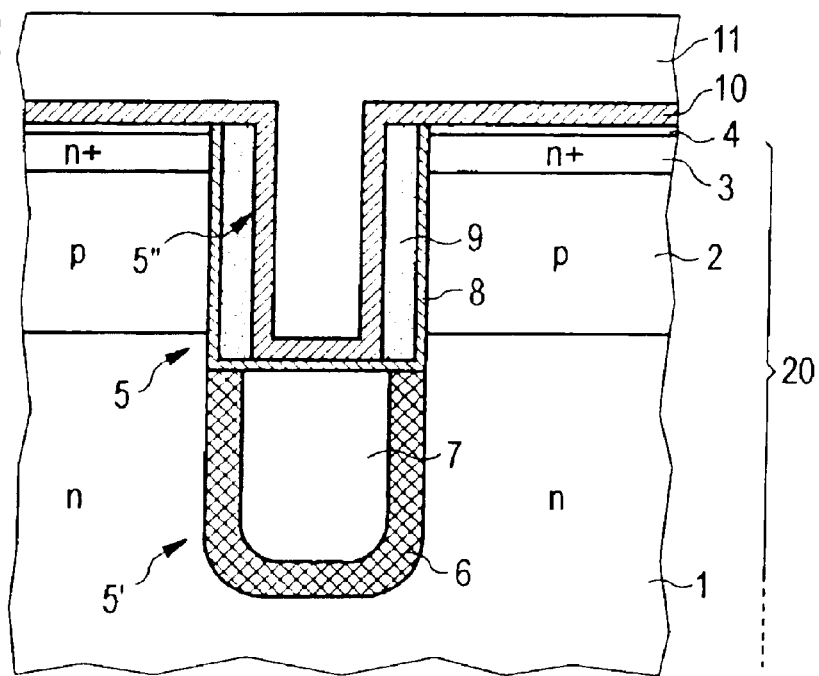
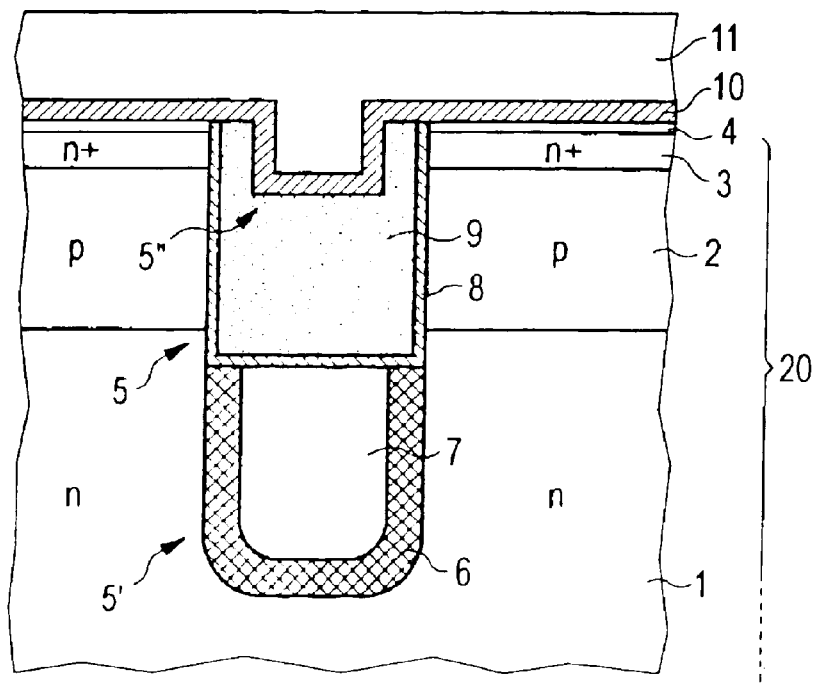

VERTICAL NON-VOLATILE SEMICONDUCTOR MEMORY CELL AND METHOD FOR MANUFACTURING THE MEMORY CELL

BACKGROUND OF THE INVENTION

FIELD OF THE INVENTION

The present invention relates to a vertical non-volatile semiconductor memory cell and an associated manufacturing method, and in particular to an EPROM (Erasable Programmable Read Only Memory), an EEPROM (Electronically Erasable Programmable Read Only Memory) and a FLASH-EEPROM memory cell with low area requirements.

Rewritable non-volatile semiconductor memory cells are increasingly gaining importance in highly integrated circuits because they can store variable data over a long period in, for example, chip cards, multimedia cards and what are referred to as smart cards, without the use of a voltage supply. The various applications result in different requirement profiles which require different technological implementations. What are referred to as embedded non-volatile memories in which the non-volatile storage function is implemented simultaneously with further functions while taking into account their requirement profiles on the same chip are becoming increasingly important.

Depending on the type of non-volatile semiconductor memory cells used, in particular depending on the programming and erasure methods on which they are based, a fundamental distinction is made between EPROMs, EEPROMs and FLASH-EEPROM memories. Suitable memories, which can be embedded are almost exclusively electrically programmable and erasable as well as repeatedly re-writable memories (EEPROM, FLASH).

For these applications, known, conventional non-volatile semiconductor cells are usually composed of a semiconductor substrate, an isolating tunnel oxide layer, a floating gate layer or charge storage layer, an isolating dielectric layer and a conductive control layer which are formed on the surface of the semiconductor substrate. In order to store information, charges are introduced via the tunnel oxide layer into the floating gate layer from a channel region formed in the semiconductor substrate. Methods for introducing the charges into the floating gate layer are, for example, the injection of hot charge carriers and Fowler-Nordheim tunneling.

However, a disadvantage with such conventional non-volatile semiconductor memory cells is, on the one hand, the relatively high amount of space required, which is a result in particular of their formation on the surface of the semiconductor substrate. On the other hand, the space required cannot be reduced by scaling or shrinking as is known with logic technologies because the minimum structure sizes are largely fixed as a result of the programming and erasure voltages which are necessary due to the physical mechanism.

Therefore, three-dimensional arrangements for non-volatile semiconductor memory cells are increasingly being proposed in order to reduce the area further, in which arrangements, for example, the isolating tunnel oxide layer, the floating gate layer and the control layer are arranged vertically in the semiconductor substrate.

FIG. 1 shows a sectional view of such a vertical non-volatile semiconductor memory cell as is known, for example, from International Publication WO97/02599. According to this publication, a trench 140 is formed in a semiconductor substrate 200 which has, for example, a weakly doped p type region 100, a p type doped well 110 and a highly doped $n^+$ type region 120. By means of an ancillary layer 130 and a mask layer (not illustrated), a further highly doped $n^+$ type region 150 is formed on the bottom of the trench 140. The highly doped $n^+$ type regions 150 and 120 constitute here what are referred to as drain and source regions of the vertical non-volatile semiconductor memory cell. A tunnel oxide layer 160 serving as a dielectric layer is formed on the walls and on the bottom of the trench 140. Adjoining this are the floating gate layer 170 for storing charges and a second dielectric layer 180 which is composed of an ONO (Oxide-Nitride-Oxide) layer sequence. In order to drive the non-volatile semiconductor memory cell, there is a control layer 190, which is composed of highly doped polysilicon, and which is located on the second dielectric layer 180.

In this way, a vertical non-volatile semiconductor memory cell requiring a smaller area is obtained because the minimum necessary channel length of the storage cell now extends vertically in the semiconductor substrate 200, and a greater degree of reduction of the structure sizes on the surface of the semiconductor substrate is made possible. However, a disadvantage with such a conventional vertical non-volatile semiconductor memory cell is the low data retention properties which result, in particular, from a charge loss in the direction of the semiconductor substrate 200.

SUMMARY OF THE INVENTION

It is accordingly an object of the invention to provide a vertical non-volatile semiconductor memory cell and an associated manufacturing method which overcomes the above-mentioned disadvantageous of the prior art apparatus and methods of this general type. In particular, it is an object of the invention to provide a vertical non-volatile semiconductor memory cell and an associated manufacturing method in which improved data retention properties or an improved "retention time" are/is obtained.

With the foregoing and other objects in view there is provided, in accordance with the invention, a vertical non-volatile semiconductor memory cell that includes a substrate having a surface, a drain region, a channel region and a source region. A trench is formed in the substrate from the source region to the drain region. The trench is formed vertically, essentially perpendicular to the surface of the substrate. The trench has trench walls. A first dielectric layer is formed essentially on the trench walls. A charge storage layer for storing charges is essentially formed on the first dielectric layer. The charge storage layer has a surface. A second dielectric layer is formed at least partially on the surface of the charge storage layer. A control layer is formed essentially on the surface of the second dielectric layer and that has a surface. A trench extension is formed essentially underneath the trench. The trench extension has a surface. A third dielectric layer is located on the surface of the trench. A filler material is provided for at least partially filling the trench extension.

Greatly improved data retention properties are obtained in a particularly cost-effective way, in particular by using a trench extension which is formed essentially underneath a trench in which the vertical non-volatile semiconductor memory cell is located, because a charge loss from a charge-storing layer into a substrate is greatly reduced. The trench extension here has a third dielectric layer on its trench surface and is at least partially filled with an isolating or electrically conductive filler material.

A further improvement in the data retention properties is obtained in the case of an electrically conductive filler material by means of an additional isolation of the charge storage layer of the semiconductor memory cell from the filler material of the trench extension. The "retention time" can thus be further improved.

However, this additional isolation between the filler material and the charge storage layer can also be dispensed with as an alternative, or in order to reduce the costs, in which case very good data retention properties for the non-volatile semiconductor memory cell can continue to be obtained if the third dielectric layer on the surface of the trench extension is suitably configured.

In order to optimize a coupling factor, a second dielectric layer and a control layer can extend to the substrate, both within the trench and within the trench extension, as a result of which minimum programming voltages can be set as a function of a respective layout and associated parasitic capacitances.

A first dielectric layer is preferably composed of a tunnel layer, and a second and third dielectric layer are preferably composed of an ONO layer sequence. The vertical non-volatile semiconductor memory cell is capable of being manufactured in a particularly cost-effective and simple way.

However, in order to improve the coupling factor further, the second dielectric layer can also have a dielectric with a particularly high relative dielectric constant, in which case, in particular, metal oxide materials are used. The necessary operating and switch-on voltages can be reduced further in this way.

With the foregoing and other objects in view there is also provided, in accordance with the invention, a method for manufacturing a vertical non-volatile semiconductor memory cell, that includes steps of: providing a substrate; forming a deep trench in the substrate, providing the deep trench with a third dielectric layer, and filling the deep trench with a filler material; partially removing the filler material and the third dielectric layer in the deep trench to form an upper trench; forming a first dielectric layer in the upper trench; forming a charge storage layer in the upper trench; forming a control layer trench at least partially in the charge storage layer; forming a second dielectric layer in the control layer trench; forming a control layer in the control layer trench; and forming a collar isolation, a flat trench isolation and connecting elements.

In accordance with an added feature of the invention, the control layer trench is etched into the upper trench.

In accordance with an additional feature of the invention, the control layer trench is etched into the deep trench.

In accordance with a concomitant feature of the invention, the control layer trench is etched into the substrate.

In particular when a DRAM process is used to form deep trenches, the vertical non-volatile semiconductor memory cell can be manufactured in a particularly cost-effective way. The lower part of the deep trench forms the trench extension, while the upper part includes the actual non-volatile semiconductor memory cell. In addition, this provides a particularly cost-effective way of combining non-volatile semiconductor memory cells with dynamic semiconductor memory cells in embedded DRAM processes.

Other features which are considered as characteristic for the invention are set forth in the appended claims.

Although the invention is illustrated and described herein as embodied in vertical non-volatile semiconductor memory cell and method for manufacturing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 shows a simplified sectional view of a first exemplary embodiment of a vertical non-volatile semiconductor memory cell;

FIG. 3 shows a simplified sectional view of a second exemplary embodiment of a vertical non-volatile semiconductor memory cell;

DESCRIPTION OF THE PREFERRED EMBODIMENTS

Figure 1:
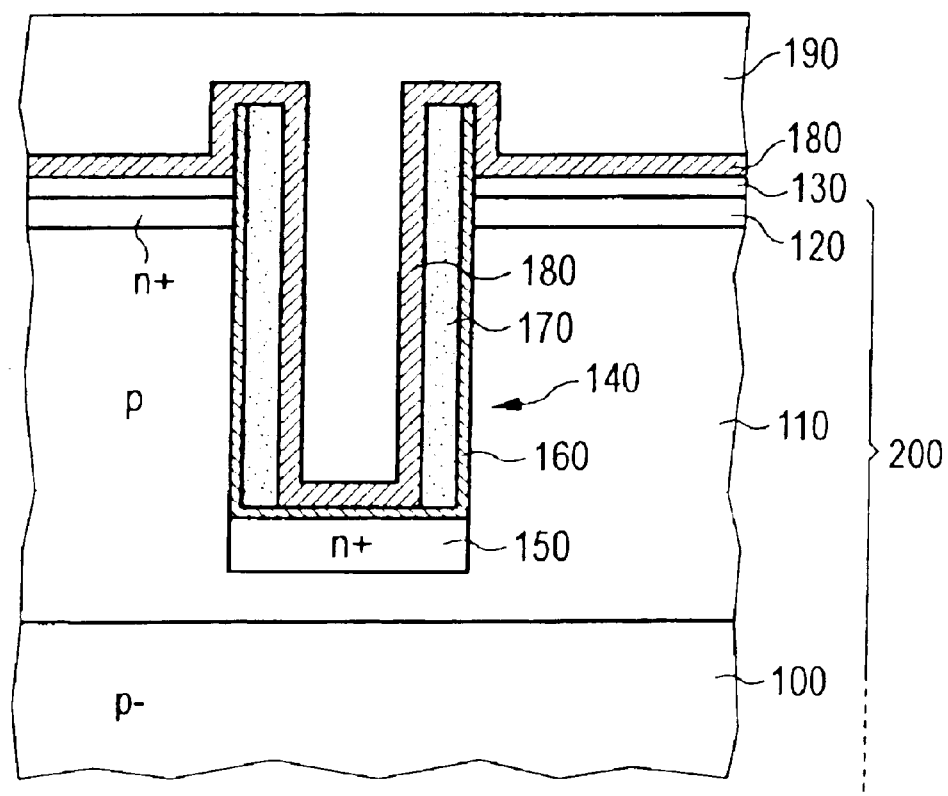
FIG. 1 shows a simplified sectional view of a prior art vertical non-volatile semiconductor memory cell.

Referring now to the figures of the drawing in detail and first, particularly, to FIG. 2 thereof, there is shown a simplified sectional view of a first embodiment of a vertical non-volatile semiconductor memory cell.

FIG. 2 shows a semiconductor substrate 20 that is composed of an n type doped base layer 1 and that has a p doped semiconductor layer 2 deposited epitaxially thereon, with $n^+$regions 3 formed therein. The semiconductor substrate 1 is preferably composed of Si. However, it can also have an SiGe, SiC, GaAs or some other compound conductor, and can be embedded in a multilayer structure made of isolating, semiconducting and conductive layers, for example, in the manner of SOS and SOI. In the same way, reverse doping for the regions 1, 2 and 3 can also be used, as a result of which a p-n-p layer sequence is obtained. In the same way, the semiconductor layer 2 can also be formed by means of diffusion or by some other means.

A depression is formed in the semiconductor substrate 20, extending as far as the base layer 1, using an auxiliary layer 4 and a mask layer (not illustrated). The lower part of this depression constitutes the later trench extension 5', while an upper part forms the trench 5 for the actual vertical non-volatile semiconductor memory cell.

The trench extension 5' is coated on its surface with a third dielectric layer 6 which is preferably composed of an ONO layer sequence (oxide/nitride/oxide). The remaining space in the trench extension 5' is filled with a filler material 7, which is preferably composed of polysilicon. However, it can also be composed of a silicide, for example MoSi, WSi etc., or have an electrically isolating material. The third dielectric layer 6 and the filler material 7 are preferably formed in the entire trench 5 and 5', and subsequently countersunk by means of a suitable etching method to a depth just below the p type doped layer 2 which forms a channel layer. A first dielectric layer 8, which acts as a tunnel layer of the vertical non-volatile semiconductor memory cell, is subsequently formed on the surface of the trench 5, for example, by means of thermal oxidation. This tunnel layer 8 is preferably composed of $SiO_2$, but other suitable thin tunnel layers can also be used.

In order to improve the isolation of the trench extension 5', it is possible to provide reinforcement (not illustrated) of the first dielectric layer 8, before or during the production of the first dielectric layer on the upper edge of the filler material 7 and the directly adjacent wall of the trench 5, for example as far as the upper edge of the layer 1. This reinforcement can advantageously be obtained using, for example, different oxidation rates of the filler material 7 and of the semiconductor layers 1 and 2. Likewise, suitable combinations of deposition and etching processes, in particular using an anisotropy, are possible in order to manufacture the reinforcement.

FIG. 2 shows that the trench 5 is also filled with a charge storage layer 9 composed, for example, of polysilicon or a silicide, and is subsequently etched, or only the side walls of the trench 5 are coated, as a result of which, a control layer trench 5" is formed. According to FIG. 2, this control layer trench 5" extends to the bottom of the trench 5. A second dielectric layer 10, which is in turn composed, for example, of an ONO layer sequence, is formed on the side walls of the control layer trench 5". However, in order to increase a coupling factor of the non-volatile semiconductor memory cell, this second dielectric layer 10 can also be composed of a dielectric with a high relative dielectric constant $\epsilon_r$, in which in particular metal oxides can be used. Such metal oxides, which can be used for the second dielectric layer 10 are, for example, $TiO_2$, $Wo_x$, $Al_2O_3$ etc.

The control layer trench 5" is subsequently filled with an electrically conductive control layer 11 or control filler layer 11', which forms a control gate terminal of the non-volatile semiconductor memory cell. This control layer 11 or control filler layer 11' is composed, for example, of highly doped polysilicon, but can also be composed of any other electrically conductive material, for example silicide. Furthermore, a material which is different from the surface material 11 can be used for the control filler layer 11' located in the control layer trench 5", as a result of which optimum filling, and thus optimum formation of a contact, can be realized, in particular with very fine structures. The filling of the control layer trench 5" can also be constructed from more than two layers in the same way.

In this way, a vertical non-volatile semiconductor memory cell is obtained whose channel length is determined essentially by the thickness of the layer 2. By using the base layer 1, space can be saved, to be used for a contact, in which case an additional topological structure on the surface is also avoided by moving the charge storage layer 9 to the trench, and a shrink capability is thus improved. However, in particular as a result of the trench extension 5' with its additional dielectric layer 6 and the filler material 7 located in it, the data retention properties of the semiconductor memory cell are enhanced, which improves in particular what is referred to as the "retention time". Furthermore, such a non-volatile semiconductor memory cell can be manufactured at low cost because the formation of such deep trenches or depressions with the associated dielectric layer and the filler material from a multiplicity of standard processes is already known, and no additional costs are therefore incurred. A detailed description of this advantage is given below with reference to FIG. 6.

FIG. 3 shows simplified sectional view of a second embodiment of a vertical non-volatile semiconductor memory cell. Identical reference symbols indicate identical layers or elements and a repeated description is dispensed with below.

FIG. 3 shows that the essential difference between this second exemplary embodiment and the semiconductor memory cell shown in FIG. 2 is that the control layer trench 5" is countersunk only partially into the charge storage layer 9, as a result of which improved charge retention properties and programming properties can be obtained for specific materials. In the extreme case (not illustrated), the control layer trench 5" can be virtually eliminated here, as a result of which the second dielectric layer 10 extends completely parallel to the surface of the semiconductor substrate, and the topological properties are greatly improved. In particular in the case of materials, which are highly topologically dependent, this results in a significant simplification and improvement of the manufacturing process, but generally worsens a coupling factor.

Figure 4:
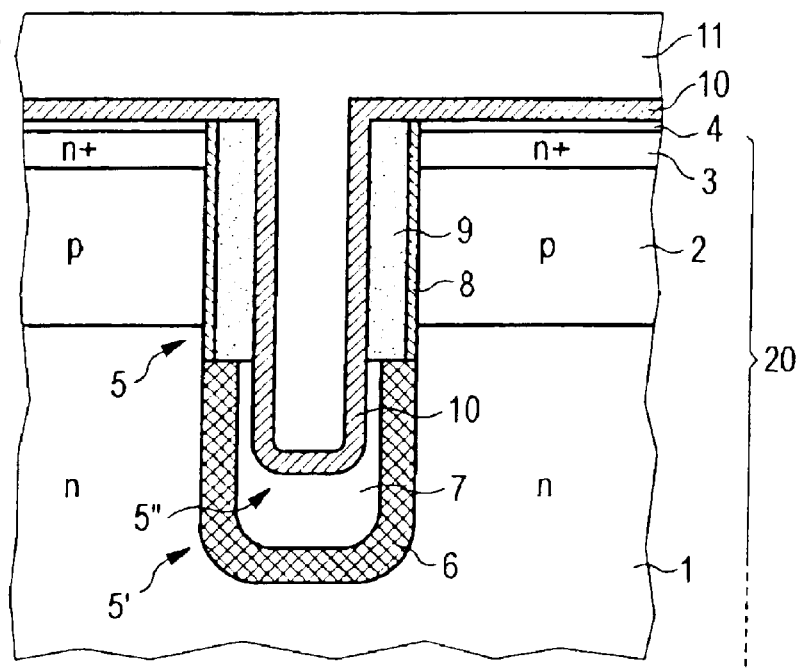
FIG. 4 shows a simplified sectional view of a third exemplary embodiment of a vertical non-volatile semiconductor memory cell.

FIG. 4 shows a simplified sectional view of a third exemplary embodiment of a vertical non-volatile semiconductor memory cell. Identical reference symbols again designate identical layers or elements and a repeated description is dispensed with below.

FIG. 4 shows that the first dielectric layer 8, which is present on the bottom can now be dispensed with and a direct contact can be formed between the filler material 7 and the charge storage layer 9. If appropriate materials, for example highly doped polysilicon (conductive), are used for both the charge storage layer 9 and for the filler material 7, the coupling factor of the semiconductor memory cell can thus be significantly improved.

However, the control layer trench 5" can also additionally extend into the filler material 7, as a result of which a coupling factor can be further optimized, and furthermore an etching process window for forming the control layer trench 5" can be made significantly less critical. The manufacturing costs can thus be reduced further. Nevertheless, in particular by using the third dielectric layer 6, the data retention properties of the semiconductor memory cell can continue to be improved, in contrast to conventional vertical semiconductor memory cells.

Figure 5:
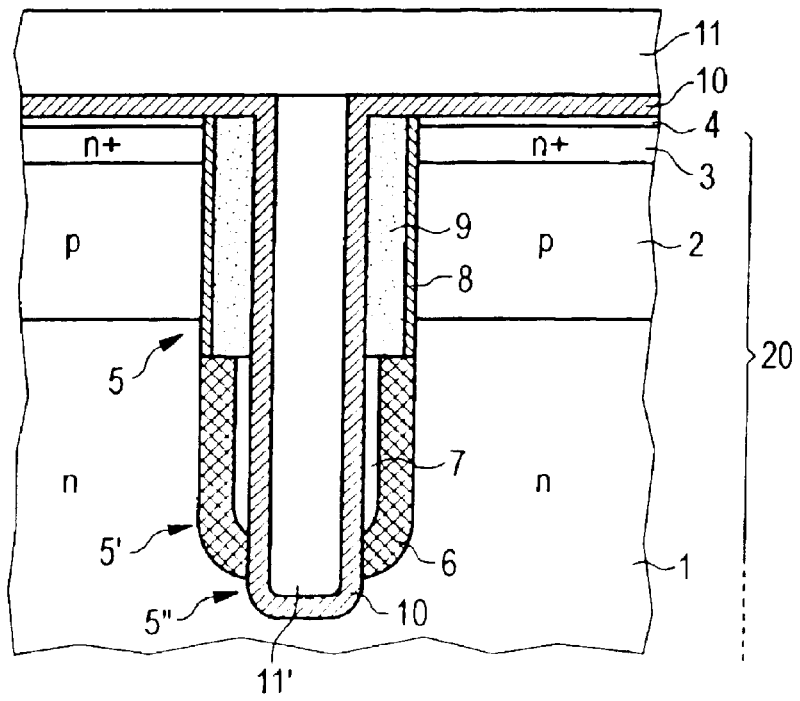
FIG. 5 shows a simplified sectional view of a fourth exemplary embodiment of a vertical non-volatile semiconductor memory cell.

FIG. 5 shows a simplified sectional view of a fourth exemplary embodiment of a vertical non-volatile semiconductor memory. Identical reference symbols again designate identical layers and a repeated description is dispensed with below.

FIG. 5 shows that the control layer trench 5" extends from the surface of the semiconductor substrate 20 through the charge storage layer 9 and the filler material 7 into the substrate or the base layer 1. In such a semiconductor memory cell, a particularly less critical etching process window for the control layer trench 5" is obtained, as a result of which the manufacturing costs can be reduced further. Furthermore, if suitable materials are used a coupling factor of the semiconductor memory cell can be improved further because the surface between the control layer 11 and the control filler layer 11' used in the control layer trench 5" is increased further. In particular when highly doped polysilicon is used as the charge storage layer 9 and as a filler material 7, these then act together as a charge storage layer, in which case in particular the data retention properties and thus the "retention time" of the semiconductor memory cell are also improved by virtue of the third dielectric layer 6.

According to FIGS. 2 to 5, an auxiliary layer 4 was used for masking in each case; however, it can also be dispensed with. In addition, a non-volatile charge storage layer (for example nitride) or some other charge-storing material can also be used instead of an electrically conductive charge storage layer 9 (highly doped polysilicon).

A vertical non-volatile semiconductor memory cell with an associated selector transistor as an EEPROM memory cell in a preferred fifth exemplary embodiment is described below.

Figure 6:
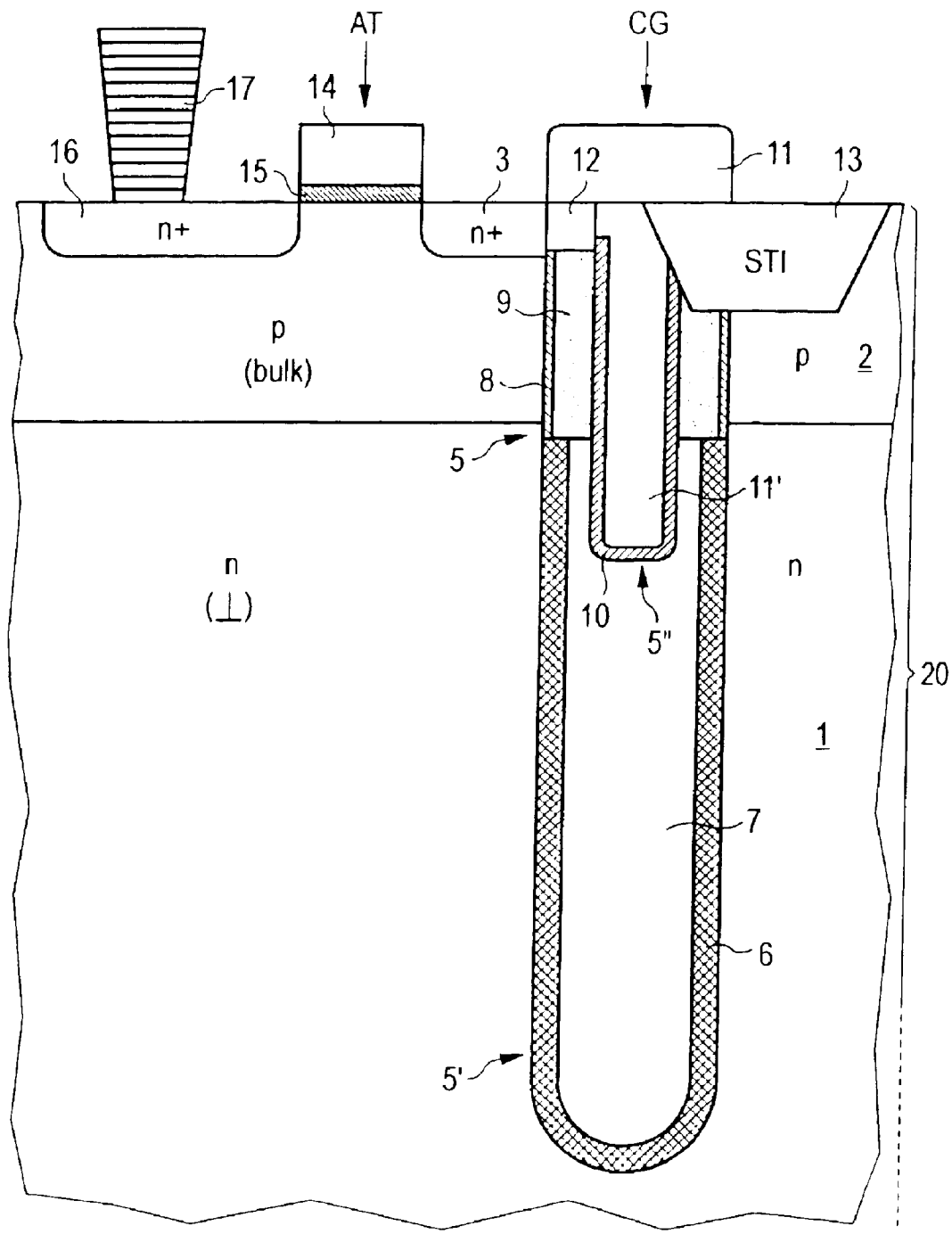
FIG. 6 shows a simplified sectional view of a fifth exemplary embodiment of a vertical non-volatile semiconductor memory cell.

FIG. 6 shows a simplified sectional view of the fifth exemplary embodiment. Identical reference symbols again designate identical layers or elements and a repeated description is dispensed with below. FIG. 6 shows that the vertical non-volatile semiconductor memory cell is integrated directly into a DRAM process, as a result of which the manufacturing costs can be reduced further on the basis of already known process sequences, and the non-volatile semiconductor memory cell can be manufactured in what is referred to as an embedded DRAM process. To be more precise, in this way both DRAM memory cells and non-volatile vertical semiconductor memory cells with improved data retention properties can be manufactured particularly cost-effectively on the same wafer.

FIG. 6 shows that the EEPROM semiconductor memory cell has a very similar structure to a conventional DRAM semiconductor memory cell with a trench capacitor. To be more precise, the same processes as for the trench capacitor in a DRAM memory cell are used to form the trench extension 5' and the trench 5'. A deep trench is first made in the semiconductor substrate 20 and then the trench is at least partially filled with a dielectric layer 6 and an electrically conductive filler material 7. The deep trench here can have a bottle shape (not illustrated) and also a buried plate (not illustrated), which is necessary in DRAM memory cells.

Formation of the deep trench 5 or 5', of the third dielectric layer 6 and of the filler material 7 and the countersinking of the filler material 7 and removal of the third dielectric layer 6 in the upper region of the trench thus corresponds to the corresponding steps during the manufacture of a DRAM trench capacitor. A detailed description is not given below because the steps are sufficiently known to the person skilled in the art.

However, with the method according to the invention for manufacturing the vertical non-volatile semiconductor memory cell, instead of producing the isolation collar in the DRAM process the first dielectric layer 8 is preferably formed as an $SiO_x$ tunnel layer on the trench walls of the trench 5 and is subsequently filled with a charge storage layer 9, which is preferably composed of highly doped polysilicon. The highly doped polysilicon layer 9 lies here directly on the (possibly highly doped) polysilicon layer, serving as the filler material 7, of the trench extension 5', resulting in a virtually enlarged charge storage layer 9 or 7. Subsequently, a control layer trench 5" is preferably formed at least partially in the charge storage layer 9 by means of an anisotropic etching process. The control layer trench 5' extends, according to FIG. 6, into the filler material 7. The second dielectric layer 10 is then formed in the control layer trench 5", in which case an ONO layer sequence or a dielectric with a high relative dielectric constant $\epsilon_r$ is preferably used. A (filler) control layer 11' is then formed in the remaining part of the control layer trench 5" and is preferably composed of an electrically conductive polysilicon.

A control gate layer 11 is located on the surface of the substrate and is in contact with the (filler) control layer 11' in order to form a control gate CG of the non-volatile semiconductor memory cell. In order to avoid undesired leakage currents at the surface, an isolation collar 12 is located at an upper region of the trench 5. The further elements, for example such as the selector transistor AT composed of a gate 14 of an isolation trench 15, and drain and source regions 3 and 16 with a contact terminal 17 are in turn formed with a conventional DRAM process. In the same way, respectively adjacent vertical non-volatile semiconductor memory cells (not illustrated) are separated from one another by a shallow trench isolation 13 (STI) present in the DRAM process.

As in the exemplary embodiments shown in FIGS. 2–5, the control layer trench 5" can be formed to different depths, as a result of which in particular an etching process window for this trench is made significantly less critical. The essential advantage of this fifth exemplary embodiment is that a DRAM process, which is present in any case can be used to form trench capacitors for the vertical non-volatile semiconductor memory cell according to the invention, in which case improved data retention properties are obtained. Furthermore, this permits an embedded DRAM process in which both non-volatile and dynamic semiconductor memory cells can be formed in the same semiconductor substrate. This allows new circuits to be formed in particular in smart cards and chip cards.

Figure 7:
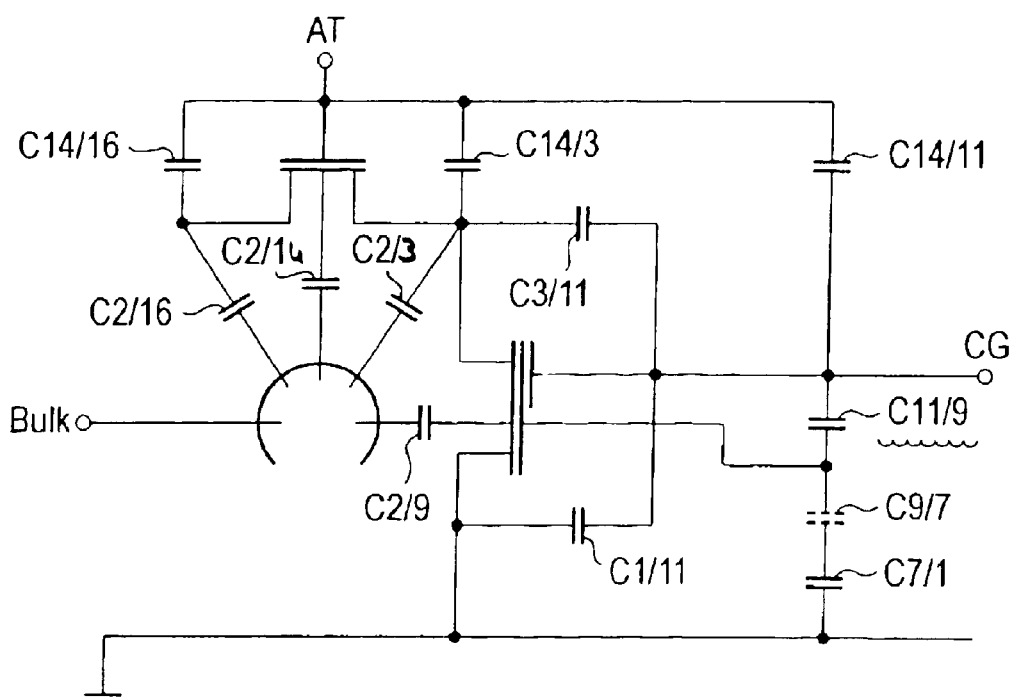
FIG. 7 shows an equivalent circuit diagram of the EEPROM memory cell illustrated in FIG. 6.

FIG. 7 shows an equivalent circuit diagram of the EEPROM semiconductor memory cell illustrated in FIG. 6. The circuit diagram will be described below in order to clarify the influence of the respective layers on a coupling factor.

FIG. 7 shows the indices of the capacitors designate the respective layers or regions of FIG. 6, which generate these capacitances. Accordingly, the selector transistor AT has parasitic capacitances $C_{14/16}$ and $C_{14/3}$ to the drain and source regions 16 and 3. In addition, there are parasitic capacitances $C_{2/16}$, $C_{2/14}$, $C_{2/9}$ and $C_{2/3}$ to the epitaxially grown p type layer 2 (bulk), which serves as a channel layer. The actual non-volatile vertical semiconductor memory cell has parasitic capacitances $C_{3/11}$ and $C_{1/11}$ from the control layer 11 or 11' to the $n^+$ type region 3 and to the n type base layer 1. There is a further parasitic capacitance $C_{14/11}$ between the control layer 11 and the control gate layer 14 of the selector transistor, the capacitance $C_{7/1}$ constituting a capacitance between the filler material and the n type base layer 1. When an optimum isolating layer is used between the filler material 7 and the charge storage layer 9 there is additionally the capacitance $C_{9/7}$ between these two materials.

In order to obtain the highest possible coupling factor, in particular, a capacitance $C_{11/9}$ between the control layer 11 or 11' and the charge storage layer 9 must be as large as possible, or the entire capacitance of the remaining capacitors must be as low as possible. Given knowledge of this relationship it is possible to use suitable materials for the respective layers and trenches and to vary the depth of the control layer trench 5" in order to set an optimum or maximum coupling value or coupling factor. In this way, in addition to the improved data retention properties, particularly favorable programming voltages can also be obtained.

I claim:

1. A vertical non-volatile semiconductor memory cell, comprising:

a substrate having a surface, a drain region, a channel region and a source region;

a trench formed in said substrate from said source region to said drain region, said trench formed vertically, essentially perpendicular to said surface of said substrate, said trench having trench walls;

a first dielectric layer formed essentially on said trench walls;

a charge storage layer for storing charges, said charge storage layer being formed on said first dielectric layer;

a control layer trench formed in said charge storage layer and defined by walls, said charge storage layer surrounding said control layer trench;

a second dielectric layer formed at least partially on said walls of said control layer trench and having a surface, said second dielectric layer defining a remaining part of said control layer trench;

a control layer formed essentially on said surface of said second dielectric layer, said control layer including a control filler layer formed in said remaining part of said control layer trench and a control gate layer located on said surface of said substrate;

a trench extension formed essentially underneath said trench, said trench extension having a surface;

a third dielectric layer formed on said surface of said trench extension; and a filler material for at least partially filling said trench extension, said filler material separated from said control filler layer.

2. The vertical non-volatile semiconductor memory cell according to claim 1, wherein said filler material is electrically isolated from said charge storage layer.

3. The vertical non-volatile semiconductor memory cell according to claim 1, wherein said tiller material is in electrical contact with said charge storage layer.

4. The vertical non-volatile semiconductor memory cell according to claim 1, wherein said control layer trench extends within said trench.

5. The vertical non-volatile semiconductor memory cell according to claim 1, wherein said control layer trench extends into said trench extension.

6. The vertical non-volatile semiconductor memory cell according to claim 1, wherein said control layer trench extends into said substrate beneath said trench extension.

7. The vertical non-volatile semiconductor memory cell according to claim 1, wherein said first dielectric layer has a tunnel layer.

8. The vertical non-volatile semiconductor memory cell according to claim 1, wherein said second dielectric layer includes an ONO layer sequence and said third dielectric layer includes an ONO layer sequence.

9. The vertical non-volatile semiconductor memory cell according to claim 1, wherein said second dielectric layer has a dielectric with a high relative dielectric constant.

10. The vertical non-volatile semiconductor memory cell according to claim 9, wherein said second dielectric layer has a metal oxide.

11. The vertical non-volatile semiconductor memory cell according to claim 1, wherein said filler material, said charge storage layer and said control layer include a material selected from the group consisting of an electrically conductive polysilicon and a silicide.

12. The vertical non-volatile semiconductor memory cell according to claim 1, wherein said control layer includes a surface layer and at least one control filler layer.

13. The vertical non-volatile semiconductor memory cell according to claim 1, wherein said trench and said trench extension constitute a deep trench that is formed in a DRAM process.

* * * * *